(12) United States Patent
Zhang et al.

(10) Patent No.: US 8,749,907 B2
(45) Date of Patent: Jun. 10, 2014

(54) SYSTEMS AND METHODS FOR ADAPTIVE DECODER MESSAGE SCALING

(75) Inventors: Fan Zhang, Milpitas, CA (US); Ming Jin, Fremont, CA (US); Shaohua Yang, San Jose, CA (US); Haitao Xia, San Jose, CA (US)

(73) Assignee: LSI Corporation, San Jose, CA (US)

( * ) Notice: Subject to any disclaimer, the term of this patent is extended or adjusted under 35 U.S.C. 154(b) by 95 days.

(21) Appl. No.: 13/372,580

(22) Filed: Feb. 14, 2012

(65) Prior Publication Data

US 2013/0208377 A1 Aug. 15, 2013

(51) Int. Cl.
*G11B 20/10* (2006.01)

(52) U.S. Cl.
USPC .......................................... 360/39

(58) Field of Classification Search
None
See application file for complete search history.

(56) References Cited

U.S. PATENT DOCUMENTS

| | | |
|---|---|---|
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |
| 5,392,299 A | 2/1995 | Rhines |
| 5,417,500 A | 5/1995 | Martinie |
| 5,450,253 A * | 9/1995 | Seki et al. .................. 360/65 |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,710,784 A | 1/1998 | Kindred |
| 5,717,706 A | 2/1998 | Ikeda |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccallissister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |

(Continued)

FOREIGN PATENT DOCUMENTS

WO    WO 2010126482 A1 * 11/2010

OTHER PUBLICATIONS

Casado et al., Multiple-rate low-density parity-check codes with constant blocklength, IEEE Transations on communications, Jan. 2009, vol. 57, pp. 75-83.

(Continued)

*Primary Examiner* — Thang Tran
(74) *Attorney, Agent, or Firm* — Hamilton DeSanctis & Cha (57) ABSTRACT

The present inventions are related to systems and methods for data processing, and more particularly to systems and methods for adaptively modifying a scaling factor in a data processing system.

19 Claims, 5 Drawing Sheets

(56) References Cited

U.S. PATENT DOCUMENTS

| | | |
|---|---|---|
| 6,473,878 B1 | 10/2002 | Wei |
| 6,535,553 B1 | 3/2003 | Limberg et al. |
| 6,625,775 B1 | 9/2003 | Kim |
| 6,748,034 B2 | 6/2004 | Hattori |
| 6,757,862 B1 | 6/2004 | Marianetti, II |
| 6,785,863 B2 | 8/2004 | Blankenship |
| 6,810,502 B2 | 10/2004 | Eidson et al. |
| 6,970,511 B1 | 11/2005 | Barnette |
| 6,986,098 B2 | 1/2006 | Poeppelman |
| 7,047,474 B2 | 5/2006 | Rhee |
| 7,058,873 B2 | 6/2006 | Song et al. |
| 7,073,118 B2 | 7/2006 | Greenberg et al. |
| 7,093,179 B2 | 8/2006 | Shea |
| 7,117,427 B2 | 10/2006 | Ophir et al. |
| 7,133,228 B2 | 11/2006 | Fung et al. |
| 7,184,486 B1 | 2/2007 | Wu et al. |
| 7,191,378 B2 | 3/2007 | Eroz et al. |
| 7,203,887 B2 | 4/2007 | Eroz et al. |
| 7,308,061 B1 | 12/2007 | Huang et al. |
| 7,310,768 B2 | 12/2007 | Eidson et al. |
| 7,313,750 B1 | 12/2007 | Feng et al. |
| 7,370,258 B2 | 5/2008 | Iancu et al. |
| 7,415,651 B2 | 8/2008 | Argon |
| 7,502,189 B2 | 3/2009 | Sawaguchi et al. |
| 7,523,375 B2 | 4/2009 | Spencer |
| 7,587,657 B2 | 9/2009 | Haratsch |
| 7,590,168 B2 | 9/2009 | Raghavan et al. |
| 7,646,829 B2 | 1/2010 | Ashley et al. |
| 7,702,986 B2 | 4/2010 | Bjerke et al. |
| 7,752,523 B1 | 7/2010 | Chaichanavong et al. |
| 7,779,325 B2 | 8/2010 | Song |
| 7,802,172 B2 | 9/2010 | Vila Casado et al. |
| 7,952,824 B2 | 5/2011 | Dziak et al. |
| 7,958,425 B2 | 6/2011 | Chugg et al. |
| 7,996,746 B2 | 8/2011 | Livshitz et al. |
| 8,018,360 B2 | 9/2011 | Nayak |
| 8,201,051 B2 | 6/2012 | Tan et al. |
| 8,237,597 B2 | 8/2012 | Liu et al. |
| 8,261,171 B2 | 9/2012 | Annampedu |
| 8,291,284 B2 | 10/2012 | Savin |
| 8,295,001 B2 | 10/2012 | Liu et al. |
| 2002/0067780 A1* | 6/2002 | Razzell ............... 375/341 |
| 2003/0123364 A1* | 7/2003 | Nakajima et al. ....... 369/59.22 |
| 2008/0069373 A1 | 3/2008 | Jiang |
| 2008/0304558 A1 | 12/2008 | Zhu et al. |
| 2009/0132893 A1 | 5/2009 | Miyazaki |
| 2009/0177852 A1* | 7/2009 | Chen et al. ............ 711/157 |
| 2009/0185643 A1 | 7/2009 | Fitzpatrick |
| 2011/0167227 A1 | 7/2011 | Yang |
| 2011/0258508 A1* | 10/2011 | Ivkovic et al. .......... 714/752 |
| 2011/0264987 A1 | 10/2011 | Li |
| 2012/0124118 A1 | 5/2012 | Ivkovic |
| 2012/0182643 A1 | 7/2012 | Zhang |
| 2012/0207201 A1 | 8/2012 | Xia |
| 2012/0212849 A1 | 8/2012 | Xu |
| 2012/0262814 A1 | 10/2012 | Li |
| 2012/0265488 A1 | 10/2012 | Sun |

OTHER PUBLICATIONS

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Shokrollahi "LDPC Codes: An Introduction", Digital Fountain, Inc. (Apr. 2, 2003).

Spagnol et al, "Hardware Implementation of GF(2Am) LDPC Decoders", IEEE Transactions on Circuits and Systemssi: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/295,150, Unpublished (filed Nov. 14, 2011) (Zongwang Li).

U.S. Appl. No. 13/284,767, Unpublished (filed Oct. 28, 2011) (Fan Zhang).

U.S. Appl. No. 13/269,832, Unpublished (filed Oct. 10, 2011) (Haitao Xia).

U.S. Appl. No. 13/227,544, Unpublished (filed Sep. 8, 2011) (Shaohua Yang).

U.S. Appl. No. 13/239,683, Unpublished (filed Sep. 22, 2011) (Changyou Xu).

U.S. Appl. No. 13/186,234, Unpublished (filed Jul. 19, 2011) (Haitao Xia).

U.S. Appl. No. 13/174,453, Unpublished (filed Jun. 30, 2011) (Johnson Yen).

U.S. Appl. No. 13/180,495, Unpublished (filed Jul. 11, 2011) (Chung-Li Wang).

U.S. Appl. No. 13/283,549, Unpublished (filed Oct. 27, 2011) (Wu Chang).

U.S. Appl. No. 13/305,510, Unpublished (filed Nov. 28, 2011) (Lei Chen).

U.S. Appl. No. 13/174,537, Unpublished (filed Jun. 30, 2011) (Anantha Raman Krishnan).

U.S. Appl. No. 13/284,730, Unpublished (filed Oct. 28, 2011) (Fan Zhang).

U.S. Appl. No. 13/296,022, Unpublished (filed Nov. 14, 2011) (Victor Krachkovsky).

U.S. Appl. No. 13/316,741, Unpublished (filed Dec. 12, 2011) (Yang Han).

U.S. Appl. No. 13/305,551, Unpublished (filed Nov. 28, 2011) (Yang Han).

U.S. Appl. No. 13/300,078, Unpublished (filed Nov. 18, 2011) (Chung-Li Wang).

U.S. Appl. No. 13/302,119, Unpublished (filed Nov. 22, 2011) (Lei Chen).

(56) References Cited

OTHER PUBLICATIONS

U.S. Appl. No. 13/227,416, Unpublished (filed Sep. 7, 2011) (Lei Chen).
U.S. Appl. No. 13/213,751, Unpublished (filed Aug. 19, 2011) (Fan Zhang).
U.S. Appl. No. 13/113,219, Unpublished (filed May 23, 2011) (Yang Han).
U.S. Appl. No. 13/369,468, Unpublished (filed Feb. 9, 2012) (Zongwang Li).
U.S. Appl. No. 13/340,951, Unpublished (filed Dec. 30, 2011) (Lei Chen).
U.S. Appl. No. 13/327,279, Unpublished (filed Dec. 15, 2011) (Wei Feng).
U.S. Appl. No. 13/316,858, Unpublished (filed Dec. 12, 2011) (Zongwang Li).
U.S. Appl. No. 13/362,409, Unpublished (filed Jan. 31, 2012) (Fan Zhang).
U.S. Appl. No. 13/171,615, Unpublished (filed Jun. 29, 2011) (Bradley D. Seago).
U.S. Appl. No. 13/269,852, Unpublished (filed Oct. 10, 2011) (Haitao Xia).
U.S. Appl. No. 13/340,974, Unpublished (filed Dec. 30, 2011) (Dan Liu).
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. On Information Theory, vol. 57, No. 10 (Oct. 2011).
Zhong et al., "Joint Code-Encoder Design for LDPC Coding System VLSI Implementation", ISCAS, IEEE pp. 389-392, May 2004.
Zhong et al., "High-Rate Quasi-Cyclic LDPC Codes for Magnetic Recording Channel with Low Error Floor", ISCAS, IEEE pp. 3546-3549, May 2006.
Zhong et al., "Design of VLSI Implementation-Oriented LDPC Codes", IEEE, pp. 670-673, 2003.
Zhong et al., "Quasi Cyclic LDPC Codes for the Magnetic Recording Channel: Code Design and VSLI Implementation", IEEE Transactions on Magnetics, v. 43, pp. 1118-1123, Mar. 7.
Zhong, "Block-LDPC: A Practical LDPC Coding System Design Approach", IEEE Trans. On Circuits, Regular Papers, vol. 5, No. 4, pp. 766-775, Apr. 2005.

\* cited by examiner

SYSTEMS AND METHODS FOR ADAPTIVE DECODER MESSAGE SCALING

BACKGROUND OF THE INVENTION

The present inventions are related to systems and methods for data processing, and more particularly to systems and methods for modifying a scaling factor in a data processing system.

Various data transfer systems have been developed including storage systems, cellular telephone systems, radio transmission systems. In each of the systems data is transferred from a sender to a receiver via some medium. For example, in a storage system, data is sent from a sender (i.e., a write function) to a receiver (i.e., a read function) via a storage medium. In some cases, the data processing function uses a variable number of iterations depending upon the characteristics of the data being processed. After a number of iterations through a data decoding process, performance may be reduced due to message correlation in successive iterations through the data decoding process.

Hence, for at least the aforementioned reasons, there exists a need in the art for advanced systems and methods for data processing.

BRIEF SUMMARY OF THE INVENTION

The present inventions are related to systems and methods for data processing, and more particularly to systems and methods for modifying a scaling factor in a data processing system.

Various embodiments of the present invention provide data processing systems that include a data decoder circuit and a scaling factor circuit. The data decoder circuit is operable to apply a decode algorithm to a data input to yield a decoded output. Application of the decode algorithm includes multiplying at least one element of the data input by a scaling factor. The scaling factor circuit is operable to modify the scaling factor based at least in part on the decoded output. In some cases, the decode algorithm is a belief-propagation algorithm that may be, for example, implemented to operate on a low density parity check input.

In various instances of the aforementioned embodiments, the data decoder circuit is a first data decoder circuit, the decoded output is a first decoded output, and the scaling factor is a first scaling factor. In such instances, the scaling factor circuit includes a second data decoder circuit operable to apply the decode algorithm to the data input to yield a second decoded output. Application of the decode algorithm by the second data decoder circuit includes multiplying at least one element of the data input by a second scaling factor, and the scaling factor circuit is further operable to modify the second scaling factor. In particular cases, the scaling factor circuit is operable to set the value of the second scaling factor equal to the value of the first scaling factor based at least in part on a number of errors in the first decoded output being less than a number of errors in the second decoded output, and to set the value of the first scaling factor equal to an updated value upon completion of application of the decode algorithm by the first decoder circuit. In some cases, the second decoded output is provided as a data output when the number of errors in the second decoded output is equal to zero. In various instances, the data processing system further includes a data detector circuit operable to apply a data detection algorithm to a detector input to yield a detected output. In such instances, the data input is derived from the detected output. In one particular case, application of the data detection algorithm by the data detector circuit is guided by soft data derived from the second decoded output.

In some instances of the aforementioned embodiments, the data decoder circuit is operable to re-apply a decode algorithm to the data input guided by the decoded output to yield an updated decoded output, and wherein the scaling factor circuit is operable to modify the scaling factor between two successive re-applications of the data decode algorithm by the data decoder circuit. In particular cases, the data processing system is implemented as an integrated circuit. In one or more cases, the data processing system is incorporated in a storage device or a data communication device.

Other embodiments of the present invention provide methods for data processing that include: providing a first data decoder circuit; providing a second data decoder circuit; applying a data decode algorithm by the first data decoder circuit to a data input to yield a first decoded output; and applying the data decode algorithm by the second data decoder circuit to the data input to yield a second decoded output. Application of the decode algorithm includes multiplying at least one element of the data input by a first scaling factor, and application of the decode algorithm includes multiplying at least one element of the data input by a second scaling factor. The methods further include determining the first scaling factor based at least in part on the first decoded output and the second decoded output. In some instances of the aforementioned embodiments, a value of the first scaling factor is set equal to a value of the second scaling factor when a number of errors in the second decoded output is less than a number of errors in the first decoded output. In various instances of the aforementioned embodiments, the methods further include re-applying the data decode algorithm by the first data decoder circuit to the data input guided by the first decoded output to yield a third decoded output. In such instances, re-application of the decode algorithm includes multiplying at least one element of the data input by the first scaling factor set equal to the value of the second scaling factor. In some cases, a value of the first scaling factor is maintained and a value of the second scaling is changed when a number of errors in the second decoded output is greater than a number of errors in the first decoded output. In various instances of the aforementioned embodiments, the methods further include re-applying the data decode algorithm by the first data decoder circuit to the data input guided by the first decoded output to yield a third decoded output. In such instances, re-application of the decode algorithm includes multiplying at least one element of the data input by the first scaling factor. In one or more instances of the aforementioned embodiments, the methods further include providing a data detector circuit, and applying a data detection algorithm to a detector input by the data detector circuit to yield a detected output. In such instances, application of the data detection algorithm is guided by soft data derived from the first decoded output.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF THE INVENTION

The present inventions are related to systems and methods for data processing, and more particularly to systems and methods for modifying a scaling factor in a data processing system.

Various embodiments of the present invention provide data processing systems that include a data decoder circuit and a data detection circuit. In such systems, data is processed through the data detection circuit to yield a detected output, and the detected output is processed through the data decoder circuit to yield a decoded output. The data decoder circuit may be a low density parity check (LDPC) decoder circuit that applies a belief-propagation algorithm to a received data set. As is known in the art, a data set processed by an LDPC decoder circuit (i.e., an LDPC codeword) can be represented by its parity check matrix H or a corresponding Tanner graph. Conceptually, the aforementioned belief-propagation algorithm passes soft data or log likelihood data along edges of a Tanner graph as is known in the art. Embodiments of the present invention apply a scaling factor to messages passed in the belief-propagation algorithm, and adaptively adjust the magnitude of the scaling factor to increase the likelihood that application of the algorithm applied by the data decoder circuit.

Figure 1:
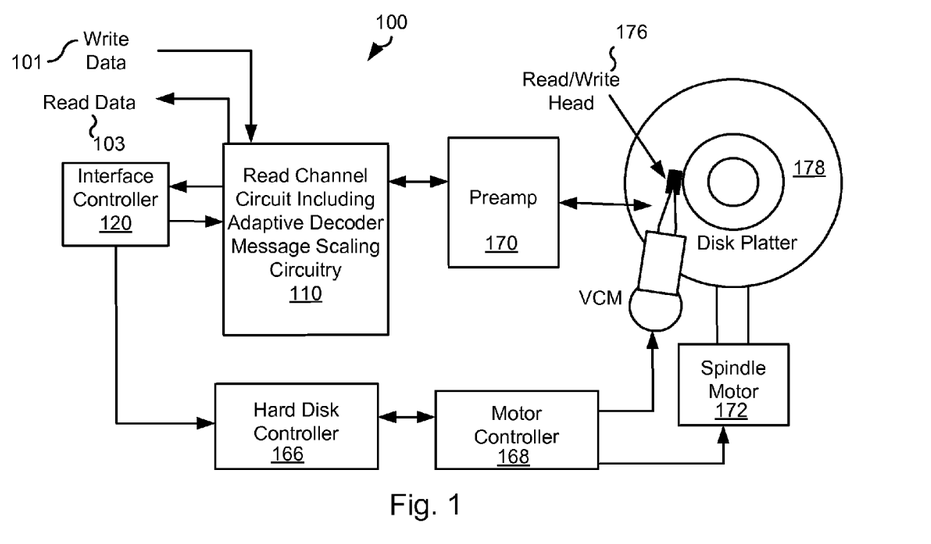
FIG. 1 shows a storage system including adaptive decoder message scaling circuitry in accordance with various embodiments of the present invention.

Turning to FIG. 1, a storage system 100 including a read channel circuit 110 including adaptive decoder message scaling circuitry is shown in accordance with various embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178. The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In a typical read operation, read/write head assembly 176 is accurately positioned by motor controller 168 over a desired data track on disk platter 178. Motor controller 168 both positions read/write head assembly 176 in relation to disk platter 178 and drives spindle motor 172 by moving read/write head assembly to the proper data track on disk platter 178 under the direction of hard disk controller 166. Spindle motor 172 spins disk platter 178 at a determined spin rate (RPMs). Once read/write head assembly 176 is positioned adjacent the proper data track, magnetic signals representing data on disk platter 178 are sensed by read/write head assembly 176 as disk platter 178 is rotated by spindle motor 172. The sensed magnetic signals are provided as a continuous, minute analog signal representative of the magnetic data on disk platter 178. This minute analog signal is transferred from read/write head assembly 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

As part of processing the received information, read channel circuit 110 utilizes a data processing circuit that includes both a data detection circuit and a data decode circuit. In some cases, multiple iterations through the data decoder circuit (i.e., local iterations) for each pass through both the data detection circuit and the data decoder circuit (i.e., global iterations). During each pass through the data decoder circuit, a scaling factor is applied to messages passed as part of the data decode algorithm and the scaling factor is adaptively adjusted in an effort to recover an originally written data set. The data processing circuit may be implemented similar to that discussed below in relation to FIGS. 3a-3c, and/or may operate using an approach similar to that discussed below in relation to FIGS. 4a-4b.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Figure 2:
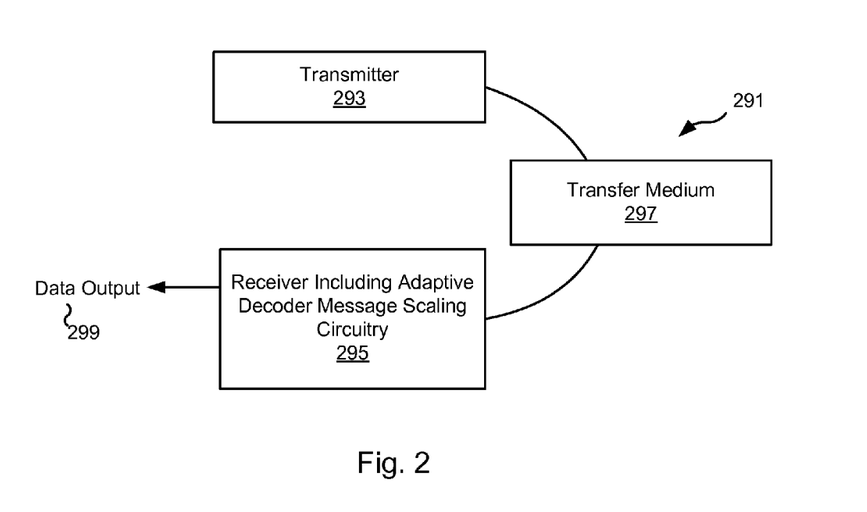
FIG. 2 depicts a data transmission system including adaptive decoder message scaling circuitry in accordance with one or more embodiments of the present invention.

Turning to FIG. 2, a data transmission system 291 including a receiver 295 having throughput preservation and clock rate reduction power control circuitry is shown in accordance with various embodiments of the present invention. Data transmission system 291 includes a transmitter 293 that is operable to transmit encoded information via a transfer medium 297 as is known in the art. The encoded data is received from transfer medium 297 by a receiver 295. Receiver 295 processes the received input to yield the originally transmitted data. Receiver 295 provides the processed data as a data output 299 to a host (not shown).

As part of processing the received information, receiver 295 utilizes a data processing circuit that includes both a data detection circuit and a data decode circuit. In some cases, multiple iterations through the data decoder circuit (i.e., local iterations) for each pass through both the data detection circuit and the data decoder circuit (i.e., global iterations). During each pass through the data decoder circuit, a scaling factor is applied to messages passed as part of the data decode algorithm and the scaling factor is adaptively adjusted in an effort to recover an originally written data set. The data processing circuit may be implemented similar to that discussed below in relation to FIGS. 3a-3c, and/or may operate using an approach similar to that discussed below in relation to FIGS. 4a-4b.

Figure 3A:
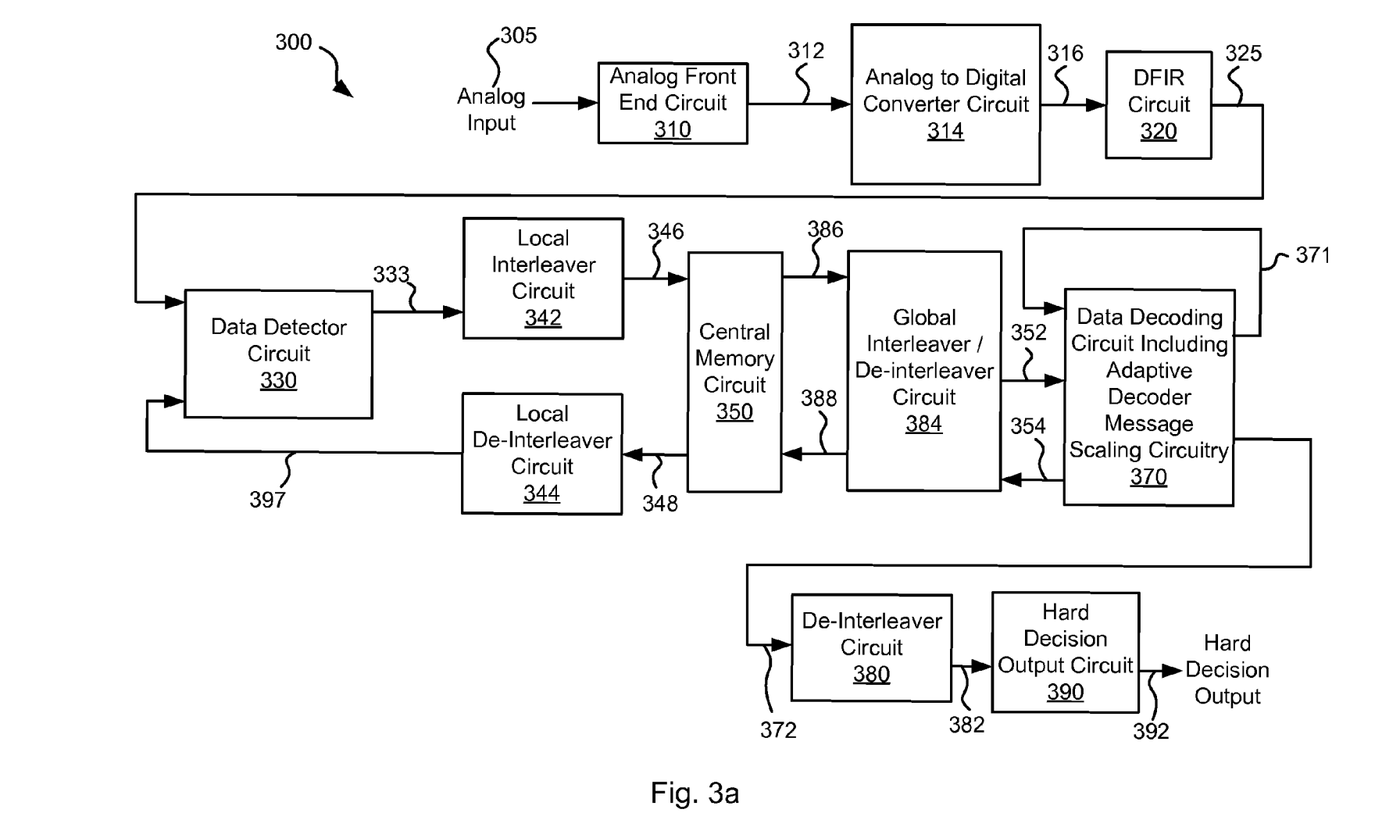
FIGS. 3a-3c show a data processing circuit including adaptive decoder message scaling circuitry in accordance with some embodiments of the present invention.
Figure 3B:
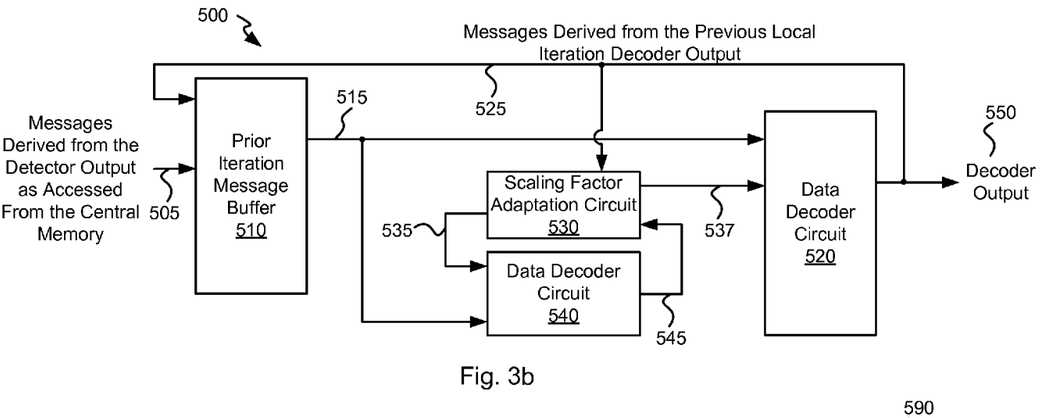
Figure 3C:
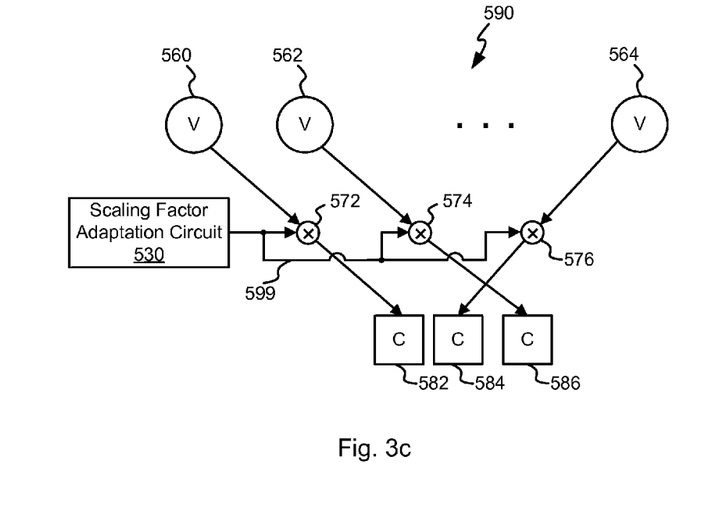

FIGS. 3a-3c show a data processing circuit 300 including adaptive decoder message scaling circuitry in accordance with some embodiments of the present invention. Turning to FIG. 3a, data processing circuit 300 includes an analog front end circuit 310 that receives an analog signal 305. Analog front end circuit 310 processes analog signal 305 and provides a processed analog signal 312 to an analog to digital converter circuit 314. Analog front end circuit 310 may include, but is not limited to, an analog filter and an amplifier circuit as are known in the art. Based upon the disclosure provided herein, one of ordinary skill in the art will recognize a variety of circuitry that may be included as part of analog front end circuit 310. In some cases, analog signal 305 is derived from a read/write head assembly (not shown) that is disposed in relation to and senses data maintained on a storage medium (not shown). In other cases, analog signal 305 is derived from a receiver circuit (not shown) that is operable to receive a signal from a transmission medium (not shown). The transmission medium may be wired or wireless. Based upon the disclosure provided herein, one of ordinary skill in the art will recognize a variety of sources from which analog input 305 may be derived.

Analog to digital converter circuit 314 converts processed analog signal 312 into a corresponding series of digital samples 316. Analog to digital converter circuit 314 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 316 are provided to an equalizer circuit 320. Equalizer circuit 320 applies an equalization algorithm to digital samples 316 to yield an equalized output 325. In some embodiments of the present invention, equalizer circuit 320 is a digital finite impulse response filter circuit as are known in the art. In some cases, equalizer 320 includes sufficient memory to maintain one or more data sets or codewords until processing of that codeword is completed through a data detector circuit 330 and a data decoding circuit 370 including, where warranted, multiple global iterations (passes through both data detector circuit 330 and data decoding circuit 370) and/or local iterations (passes through data decoding circuit 370 during a given global iteration). It may be possible that equalized output 325 may be received directly from a storage device in, for example, a solid state storage system. In such cases, analog front end circuit 310, analog to digital converter circuit 314 and equalizer circuit 320 may be eliminated where the data is received as a digital data input.

Data detector circuit 330 may be a single data detector circuit or may be two or more data detector circuits operating in parallel on different codewords. Whether it is a single data detector circuit or a number of data detector circuits operating in parallel, data detector circuit 330 is operable to apply a data detection algorithm to a received codeword or data set. In some embodiments of the present invention, data detector circuit 330 is a Viterbi algorithm data detector circuit as are known in the art. In other embodiments of the present invention, data detector circuit 330 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 330 is used to apply the data detection algorithm to the received codeword for a first global iteration applied to the received codeword, and another data detector circuit included in data detector circuit 330 is operable apply the data detection algorithm to the received codeword guided by a decoded output accessed from a central memory circuit 350 on subsequent global iterations. Data detector circuit 330 applies the data detection algorithm at a rate governed by a variable rate clock 334.

Upon completion of application of the data detection algorithm to the received codeword on the first global iteration, data detector circuit 330 provides a detector output 333. Detector output 333 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detected output 333 is provided to a local interleaver circuit 342. Local interleaver circuit 342 is operable to shuffle sub-portions (i.e., local chunks) of the data set included as detected output and provides an interleaved codeword 346 that is stored to central memory circuit 350. Interleaver circuit 342 may be any circuit known in the art that is capable of shuffling data sets to yield a re-arranged data set. Interleaved codeword 346 is stored to central memory circuit 350.

Once a data decoding circuit 370 is available, a previously stored interleaved codeword 346 is accessed from central memory circuit 350 as a stored codeword 386 and globally interleaved by a global interleaver/de-interleaver circuit 384. Global interleaver/De-interleaver circuit 384 may be any circuit known in the art that is capable of globally rearranging codewords. Global interleaver/De-interleaver circuit 384 provides a decoder input 352 into data decoding circuit 370. Data decoder circuit 370 includes adaptive decoder message scaling circuitry. One example of such adaptive decoder message scaling circuitry is described in more detail below in relation to FIGS. 3b-3c. As more fully described below, data decoder circuit implements a belief-propagation algorithm that passes soft data or log likelihood data as messages along edges of a Tanner graph. These messages are multiplied by a scaling factor that is adaptively modified during one or more local iterations through data decoder circuit 370. In some embodiments of the present invention, the data decode algorithm applied by data decoding circuit 370 is a low density parity check algorithm as are known in the art. Based upon the disclosure provided herein, one of ordinary skill in the art will recognize other decode algorithms that may be used in relation to different embodiments of the present invention. Data decoding circuit 370 applies a data decode algorithm to decoder input 352 to yield a decoded output 371. In cases where another local iteration (i.e., another pass trough data decoder circuit 370) is desired, data decoding circuit 370 re-applies the data decode algorithm to decoder input 352 guided by decoded output 371 and using a scaling factor that is adjusted for the particular local iteration. This continues until either a maximum number of local iterations is exceeded or decoded output 371 converges.

Where decoded output 371 fails to converge (i.e., fails to yield the originally written data set) and a number of local iterations through data decoder circuit 370 exceeds a threshold, the resulting decoded output is provided as a decoded output 354 back to central memory circuit 350 if a maximum number of global iterations as indicated by a global iteration control 398 has not been exceeded. In this case, decoded output 354 is stored awaiting another global iteration through a data detector circuit included in data detector circuit 330. Prior to storage of decoded output 354 to central memory circuit 350, decoded output 354 is globally de-interleaved to yield a globally de-interleaved output 388 that is stored to central memory circuit 350. The global de-interleaving reverses the global interleaving earlier applied to stored codeword 386 to yield decoder input 352. When a data detector circuit included in data detector circuit 330 becomes available, a previously stored de-interleaved output 388 accessed from central memory circuit 350 and locally de-interleaved by a de-interleaver circuit 344. De-interleaver circuit 344 re-arranges decoder output 348 to reverse the shuffling originally performed by interleaver circuit 342. A resulting de-interleaved output 397 is provided to data detector circuit 330 where it is used to guide subsequent detection of a corresponding data set previously received as equalized output 325.

Alternatively, where the decoded output 371 fails to converge and the number of local iterations exceeds a maximum and the number of global iterations exceeds a maximum, an error is generated indicating a failure to converge by data decoding circuit 370. As yet another alternative, where decoded output 371 converges (i.e., yields the originally written data set), the resulting decoded output is provided as an output codeword 372 to a de-interleaver circuit 380. De-interleaver circuit 380 rearranges the data to reverse both the global and local interleaving applied to the data to yield a de-interleaved output 382. De-interleaved output 382 is provided to a hard decision output circuit 390. Hard decision output circuit 390 is operable to re-order data sets that may complete out of order back into their original order. The originally ordered data sets are then provided as a hard decision output 392.

Turning to FIG. 3b, one implementation of data decoder circuit 370 including adaptive decoder message scaling circuitry is shows as a data decoder circuit 500. Data decoder circuit 500 includes a prior iteration message buffer 510. Prior iteration message buffer 510 is operable to store either messages 505 (i.e., soft data or log likelihood ratio data) derived from the output of data detector circuit 330 where it is the first local iteration through data decoder circuit 500, or messages 535 derived from the output of a data decoder circuit 520 (i.e., corresponding to decoded output 371) for the second and later local iterations. Prior iteration message buffer 510 provides the stored messages as a decoder input 515 to both a data decoder circuit 520 and to a data decoder circuit 540.

Data decoder circuit 520 and data decoder circuit 540 each implement a belief-propagation data decode algorithm. In one particular embodiment of the present invention, the belief-propagation data decode algorithm is implemented as a low density parity check encoding algorithm. Data decoder circuit 520 and data decoder circuit 540 operate in parallel on the same data set. The result of processing by data decoder circuit 520 is a decoder output 550 including messages 525. Decoder output 550 corresponds to decoded output 371 of FIG. 3. When applying the belief-propagation algorithm, data decoder circuit 520 multiplies messages passed as edges of a Tanner graph by a scaling factor 537. In contrast, when applying the belief-propagation algorithm, data decoder circuit 540 multiplies messages passed as edges of a Tanner graph by scaling factor 535. Of note, scaling factor 535 is a next value to be tried as a scalar, and scaling factor 537 is a previous value of the scalar.

The result of processing by data decoder circuit 540 is a decoder output 545 that is provided to a scaling factor adaptation circuit 530 along with decoder output 550 from data decoder circuit 520. Scaling factor adaptation circuit 530 compares the number of errors in decoder output 550 with the number of errors in decoder output 545. In some cases, the number of errors is the number of unsatisfied parity check equations that remain at the end of application of the data decode algorithm. Where the number of errors in decoder output 550 is greater than the number of errors in decoder output 545, the value used as scaling factor 535 of the current iteration through data decoder circuit 540 is provided as the value of scaling factor 537 on the subsequent iteration through data decoder circuit 520. Alternatively, where the number of errors in decoder output 550 is less than or equal to the number of errors in decoder output 545, the value used as scaling factor 537 of the current iteration through data decoder circuit 520 is provided as the value of scaling factor 537 on the subsequent iteration through data decoder circuit 520.

FIG. 3c shows a portion of a Tanner graph 590 representing the belief-propagation algorithm applied by data decoder circuit 520 and data decoder circuit 540. As shown, log-likelihood data passing from V-nodes 560, 562, 564 to C-nodes 582, 584, 586 are provided to respective multiplication circuits 572, 574, 576 where they are multiplied by a scaling factor 599 provided from scaling factor adaptation circuit 530. Where V-nodes 560, 562, 564 to C-nodes 582, 584, 586 correspond to data decoder circuit 520, scaling factor 599 corresponds to scaling factor 537. Alternatively, where V-nodes 560, 562, 564 to C-nodes 582, 584, 586 correspond to data decoder circuit 540, scaling factor 599 corresponds to scaling factor 535.

Figure 4A:
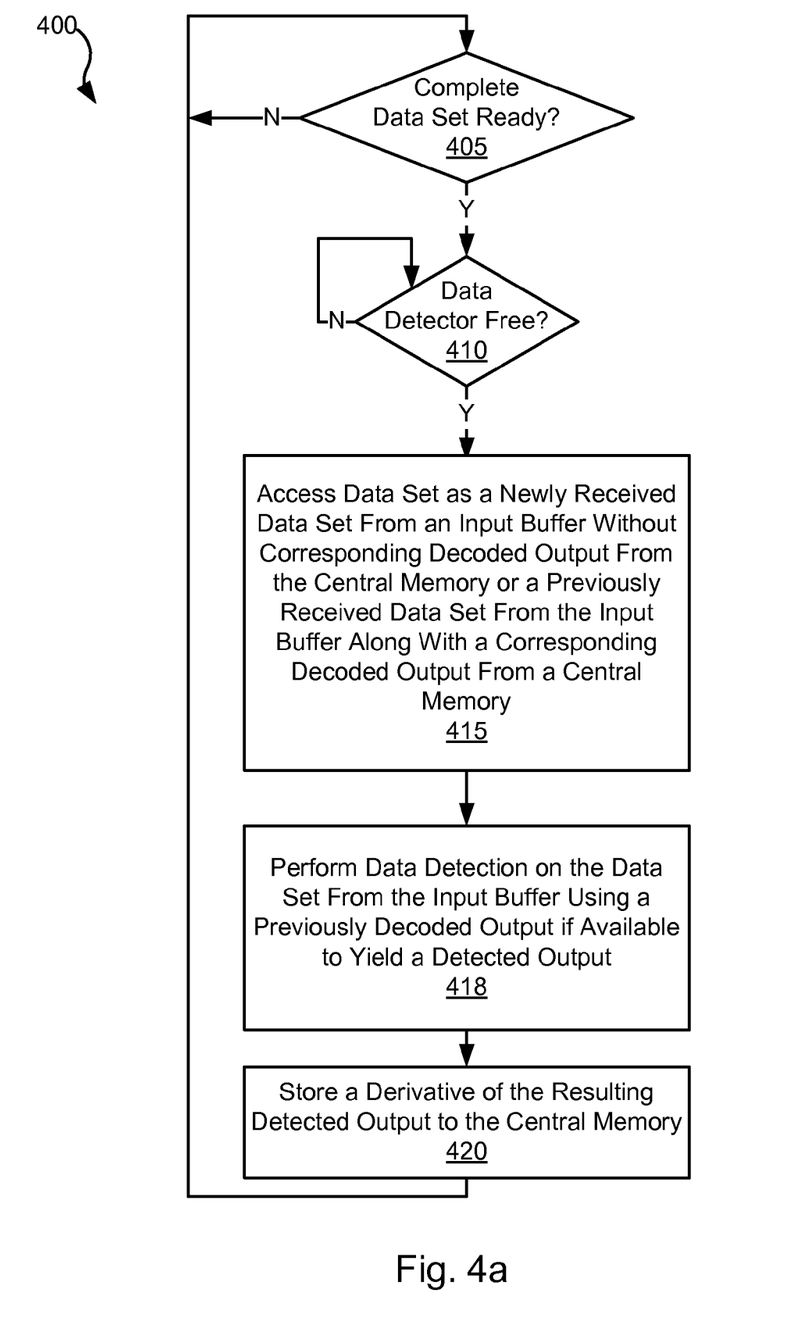
FIGS. 4a-4b are flow diagrams showing a method for data processing that includes adaptive modification of message scaling in a data decode algorithm in accordance with some embodiments of the present invention.
Figure 4B:
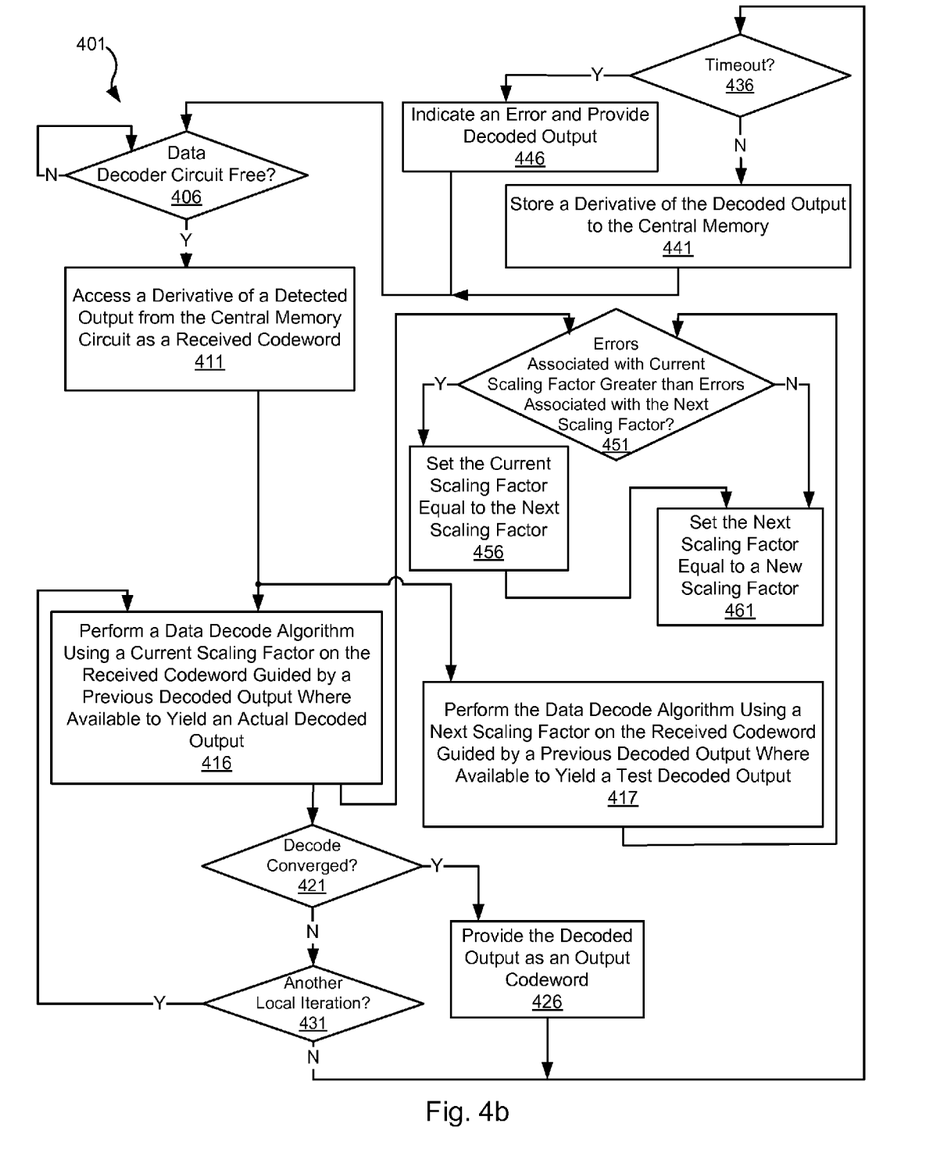

Turning to FIG. 4a, a flow diagram 400 shows a process for data processing through a data detector circuit and a data decoder circuit that includes adaptive modification of message scaling in a data decode algorithm. Following flow diagram 400, it is determined whether a data set is ready for application of a data detection algorithm (block 405). In some cases, a data set is ready when it is received from a data decoder circuit via a central memory circuit. In other cases, a data set is ready for processing when it is first made available from an front end processing circuit. Where a data set is ready (block 405), it is determined whether a data detector circuit is available to process the data set (block 410).

Where the data detector circuit is available for processing (block 410), the data set is accessed by the available data detector circuit (block 415). The data detector circuit may be, for example, a Viterbi algorithm data detector circuit or a maximum a posteriori data detector circuit. Where the data set is a newly received data set (i.e., a first global iteration), the newly received data set is accessed. In contrast, where the data set is a previously received data set (i.e., for the second or later global iterations), both the previously received data set and the corresponding decode data available from a preceding global iteration (available from a central memory) is accessed. The accessed data set is then processed by application of a data detection algorithm to the data set (block 418). The data detection is performed at a variable processing rate that is more fully described below. Where the data set is a newly received data set (i.e., a first global iteration), it is processed without guidance from decode data available from a data decoder circuit. Alternatively, where the data set is a previously received data set (i.e., for the second or later global iterations), it is processed with guidance of corresponding decode data available from preceding global iterations. Application of the data detection algorithm yields a detected output. A derivative of the detected output is stored to the central memory (block 420). The derivative of the detected output may be, for example, an interleaved or shuffled version of the detected output.

In parallel to the previously described data detection process, it is determined whether a data decoder circuit is available (block 406). The data decoder circuit may be, for example, a low density data decoder circuit applying a belief-propagation data decode algorithm as are known in the art. Where the data decoder circuit is available (block 406), a previously stored derivative of a detected output is accessed from the central memory and used as a received codeword (block 411). A data decode algorithm is applied to the received codeword using a current scaling factor to yield an actual decoded output (block 416). As previously discussed, messages (i.e., soft data) passed between nodes of the data decoder circuit are multiplied by the current scaling factor as part of applying the data decode algorithm. Where a previous local iteration has been performed on the received codeword, the results of the previous local iteration (i.e., a previous decoded output) are used to guide application of the decode algorithm. In parallel, the same data decode algorithm is applied to the received codeword using a next scaling factor to yield a test decoded output (block 417). As previously discussed, messages (i.e., soft data) passed between nodes of the data decoder circuit are multiplied by the next scaling factor as part of applying the data decode algorithm. Again, where a previous local iteration has been performed on the received codeword, the results of the previous local iteration (i.e., a previous decoded output) are used to guide application of the decode algorithm.

The actual decoded output is compared with the test decoded output to determine which includes the lowest number of errors (block 451). Where the number of errors in the test decoded output is less than the number of errors in the actual decoded output (block 451), the value of the current scaling factor is set equal to the value of the next scaling factor (block 456). This updated value of the current scaling factor will be used on a subsequent application of the data decode algorithm. Where the number of errors in the test decoded output is greater than or equal the number of errors in the actual decoded output (block 451) or after the value of the current scaling factor is set equal to the value of the next scaling factor (block 456), the value of the next scaling factor is set equal to a new value to be evaluated (block 461).

It is determined whether the actual decoded output converged (i.e., resulted in no remaining errors) (block 421). Where the decoded output converged (block 421), it is provided as a decoded output (block 426). Alternatively, where the decoded output failed to converge (i.e., errors remain) (block 421), it is determined whether another local iteration is desired (block 431). In some cases, as a default seven local iterations are allowed per each global iteration. Based upon the disclosure provided herein, one of ordinary skill in the art will recognize another default number of local iterations that may be used in relation to different embodiments of the present invention. Where another local iteration is desired (block 431), the processes of blocks 416, 417, 451, 456, 461, 421, 431 are repeated for the codeword.

Alternatively, where another local iteration is not desired (block 431), it is determined whether an other global iteration is allowed (block 436). As a default, another global iteration is allowed where there is sufficient available space in the central memory and an output memory reordering queue to allow another pass through processing the currently processing codeword. The amount of available space in the central memory and an output memory reordering queue is a function of how many iterations are being used by concurrently processing codewords to converge. For more detail on the output queue time limitation see, for example, U.S. patent application Ser. No. 12/114,462 entitled "Systems and Methods for Queue Based Data Detection and Decoding", and filed May 8, 2008 by Yang et al. The entirety of the aforementioned reference is incorporated herein by reference for all purposes. Thus, the amount of time that a codeword may continue processing through global iterations is a function of the availability of central memory and an output memory reordering queue. By limiting the number of global iterations that may be performed, the amount of time a codeword may continue processing through global iterations can be reduced. Where another global iteration is allowed (block 436), a derivative of the decoded output is stored to the central memory (block 441). Alternatively, where another global iteration is not allowed (block 436), a failure to converge is indicated and the current decoded output is provided (block 446).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/ or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for power governance. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
   a first data decoder circuit configured to apply a decode algorithm to a data input to yield a first decoded output, wherein application of the decode algorithm includes multiplying at least one node to node message derived from the data input by a first scaling factor;
   a second data decoder circuit configured to apply the decode algorithm to the data input to yield a second decoded output, wherein application of the decode algorithm by the second data decoder circuit includes multiplying at least one element of the data input by a second scaling factor; and
   a scaling factor circuit configured to: modify the first scaling factor based at least in part on the first decoded output, and modify the second scaling factor.

2. The data processing system of claim 1, wherein the decode algorithm is a belief-propagation algorithm.

3. The data processing system of claim 2, wherein the belief-propagation algorithm is implemented to operate on a low density parity check input.

4. The data processing system of claim 1, wherein the scaling factor circuit is configured to set the value of the second scaling factor equal to the value of the first scaling factor based at least in part on a number of errors in the first decoded output being less than a number of errors in the second decoded output.

5. The data processing system of claim 1, wherein the scaling factor circuit is configured to set the value of the first scaling factor equal to an updated value upon completion of application of the decode algorithm by the first decoder circuit.

6. The data processing system of claim 1, wherein the second decoded output is provided as a data output when the number of errors in the second decoded output is equal to zero.

7. The data processing system of claim 1, wherein the data processing system further comprises:
   a data detector circuit configured to apply a data detection algorithm to a detector input to yield a detected output, and wherein the data input is derived from the detected output.

8. The data processing system of claim 7, wherein application of the data detection algorithm by the data detector circuit is guided by soft data derived from the second decoded output.

9. The data processing system of claim 7, wherein the data detection algorithm is selected from a group consisting of: a maximum a posteriori data detection algorithm, and a Viterbi data detection algorithm.

10. The data processing system of claim 1, wherein the data decoder circuit configured to re-apply a decode algorithm to the data input guided by the decoded output to yield an updated decoded output, and wherein the scaling factor circuit is configured to modify the scaling factor between two successive re-applications of the data decode algorithm by the data decoder circuit.

11. The data processing system of claim 1, wherein the data processing system is implemented as an integrated circuit.

12. The data processing system of claim 1, wherein the data processing system is incorporated in a device selected from a group consisting of: a storage device, and a data communication device.

13. A method for data processing, the method comprising:
   providing a first data decoder circuit;
   providing a second data decoder circuit;
   applying a data decode algorithm by the first data decoder circuit to a data input to yield a first decoded output, wherein application of the decode algorithm includes multiplying at least one element of the data input by a first scaling factor;
   applying the data decode algorithm by the second data decoder circuit to the data input to yield a second decoded output, wherein application of the decode algorithm includes multiplying at least one element of the data input by a second scaling factor; and
   determining the first scaling factor based at least in part on the first decoded output and the second decoded output.

14. The method of claim 13, wherein a value of the first scaling factor is set equal to a value of the second scaling factor when a number of errors in the second decoded output is less than a number of errors in the first decoded output.

15. The method of claim 14, wherein the method further comprises:
   re-applying the data decode algorithm by the first data decoder circuit to the data input guided by the first decoded output to yield a third decoded output, wherein re-application of the decode algorithm includes multiplying at least one element of the data input by the first scaling factor set equal to the value of the second scaling factor.

16. The method of claim 13, wherein a value of the first scaling factor is maintained and a value of the second scaling is changed when a number of errors in the second decoded output is greater than a number of errors in the first decoded output.

17. The method of claim 14, wherein the method further comprises:
   re-applying the data decode algorithm by the first data decoder circuit to the data input guided by the first decoded output to yield a third decoded output, wherein re-application of the decode algorithm includes multiplying at least one element of the data input by the first scaling factor.

18. The method of claim 13, wherein the method further comprises:
   providing a data detector circuit; and
   applying a data detection algorithm to a detector input by the data detector circuit to yield a detected output, wherein application of the data detection algorithm is guided by soft data derived from the first decoded output.

19. A storage device, the storage device comprising:
- a storage medium;
- a head assembly disposed in relation to the storage medium and configured to provide a sensed signal corresponding to information on the storage medium;
- a read channel circuit including:
  - an analog to digital converter circuit configured to sample an analog signal derived from the sensed signal to yield a series of digital samples;
  - an equalizer circuit configured to equalize the digital samples to yield a first data set;
  - a data detector circuit configured to apply a data detection algorithm to the digital samples to yield a detected output;
  - a first data decoder circuit configured to apply a decode algorithm to a data input derived from the detected output to yield a first decoded output, wherein application of the decode algorithm includes multiplying at least one element of the data input by a first scaling factor;
  - a second data decoder circuit configured to apply the decode algorithm to the data input to yield a second decoded output, wherein application of the decode algorithm by the second data decoder circuit includes multiplying at least one element of the data input by a second scaling factor; and
  - a scaling factor circuit configured to modify the first scaling factor based at least in part on a number of errors in the first decoded output and a number of errors in the second decoded output.

* * * * *